(12) United States Patent
Liao et al.

(10) Patent No.: US 11,158,518 B2
(45) Date of Patent: Oct. 26, 2021

(54) METHODS OF ETCHING METALS IN SEMICONDUCTOR DEVICES

(71) Applicant: Taiwan Semiconductor Manufacturing Co., Ltd., Hsin-Chu (TW)

(72) Inventors: Wei-Hao Liao, Taichung (TW); Hsi-Wen Tien, Hsinchu County (TW); Chih Wei Lu, Hsinchu (TW); Pin-Ren Dai, New Taipei (TW); Chung-Ju Lee, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/582,412

(22) Filed: Sep. 25, 2019

(65) Prior Publication Data

US 2021/0090899 A1 Mar. 25, 2021

(51) Int. Cl.
| | |
|---|---|
| *H01L 23/48* | (2006.01) |
| *H01L 21/3213* | (2006.01) |
| *H01L 23/522* | (2006.01) |
| *H01L 23/532* | (2006.01) |
| *H01L 21/033* | (2006.01) |
| *H01L 21/768* | (2006.01) |

(52) U.S. Cl.
CPC .... *H01L 21/32139* (2013.01); *H01L 21/0332* (2013.01); *H01L 21/0337* (2013.01); *H01L 21/32136* (2013.01); *H01L 21/76816* (2013.01); *H01L 21/76832* (2013.01); *H01L 23/5226* (2013.01); *H01L 23/53209* (2013.01)

(58) Field of Classification Search
CPC .......... H01L 21/32839; H01L 21/0332; H01L 21/32136; H01L 21/76832; H01L 23/5226; H01L 23/53209
See application file for complete search history.

(56) References Cited

U.S. PATENT DOCUMENTS

| | | | |
|---|---|---|---|
| 6,399,508 B1* | 6/2002 | Ting | .................. H01L 21/32136 257/E21.311 |
| 9,484,220 B2* | 11/2016 | Hoinkis | ............ H01L 21/76852 |
| 2002/0072160 A1* | 6/2002 | Kim | ..................... H01L 27/1052 438/197 |
| 2009/0104768 A1* | 4/2009 | Lee | ................... H01L 21/76838 438/652 |

(Continued)

*Primary Examiner* — Phuc T Dang
(74) *Attorney, Agent, or Firm* — Haynes and Boone, LLP

(57) ABSTRACT

A semiconductor structure includes a conductive feature disposed over a semiconductor substrate, a via disposed in a first interlayer dielectric (ILD) layer over the conductive feature, and a metal-containing etch-stop layer (ESL) disposed on the via, where the metal-containing ESL includes a first metal and is resistant to etching by a fluorine-containing etchant. The semiconductor structure further includes a conductive line disposed over the metal-containing ESL, where the conductive line includes a second metal different from the first metal and is etchable by the fluorine-containing etchant, and where the via is configured to interconnect the conductive line to the conductive feature. Furthermore, the semiconductor structure includes a second ILD layer disposed over the first ILD layer.

20 Claims, 12 Drawing Sheets

(56) References Cited

U.S. PATENT DOCUMENTS

| | | | | |
|---|---|---|---|---|
| 2014/0167181 A1* | 6/2014 | Xiong | ............... | H01L 27/0629 |
| | | | | 257/379 |
| 2014/0291805 A1* | 10/2014 | Hong | ............... | H01L 23/5223 |
| | | | | 257/532 |
| 2018/0254316 A1* | 9/2018 | Tai | ............... | H01L 21/0206 |
| 2019/0067187 A1* | 2/2019 | Yang | ............... | H01L 21/76852 |

* cited by examiner

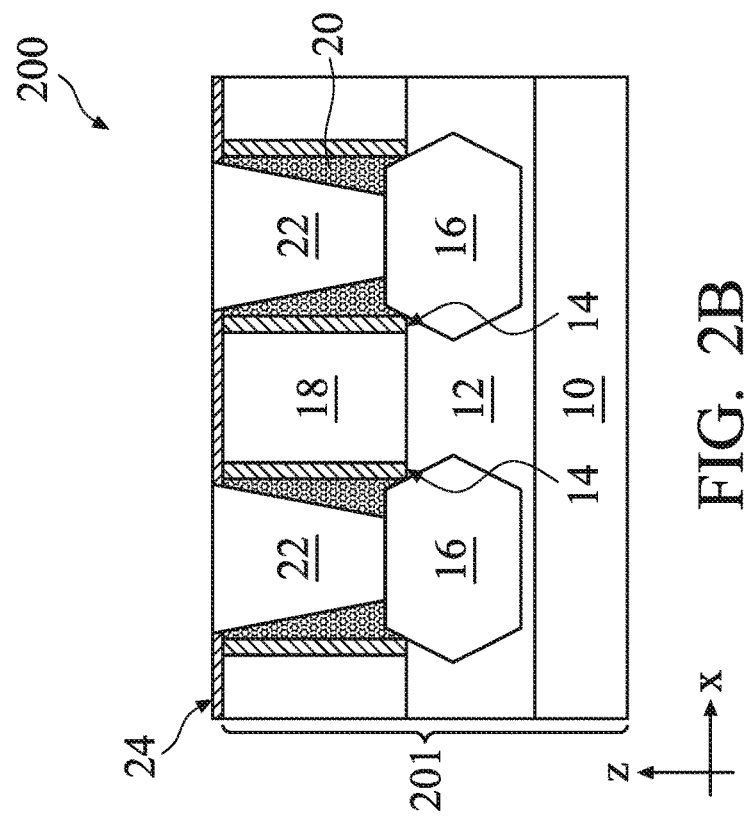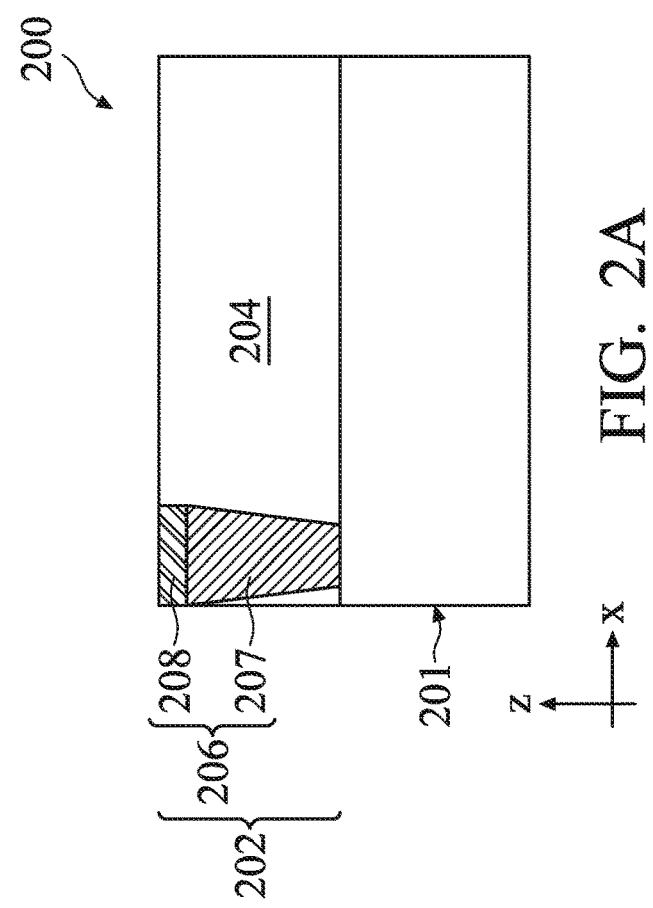
FIG. 2B
FIG. 2A

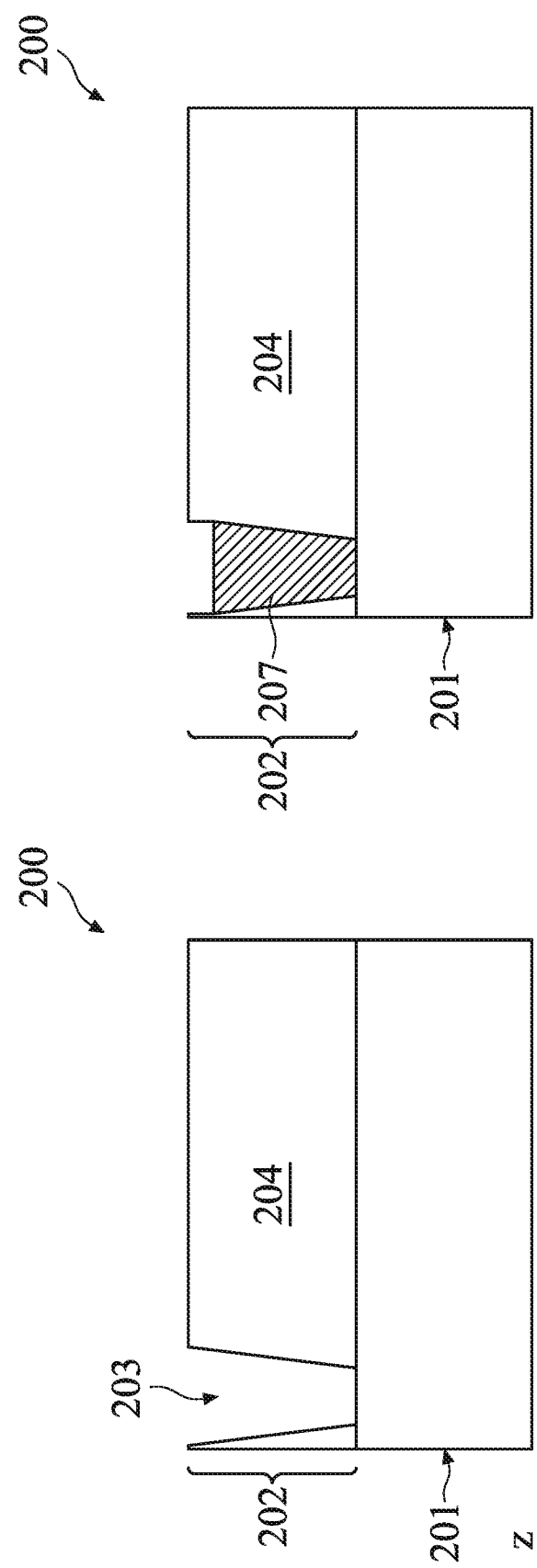

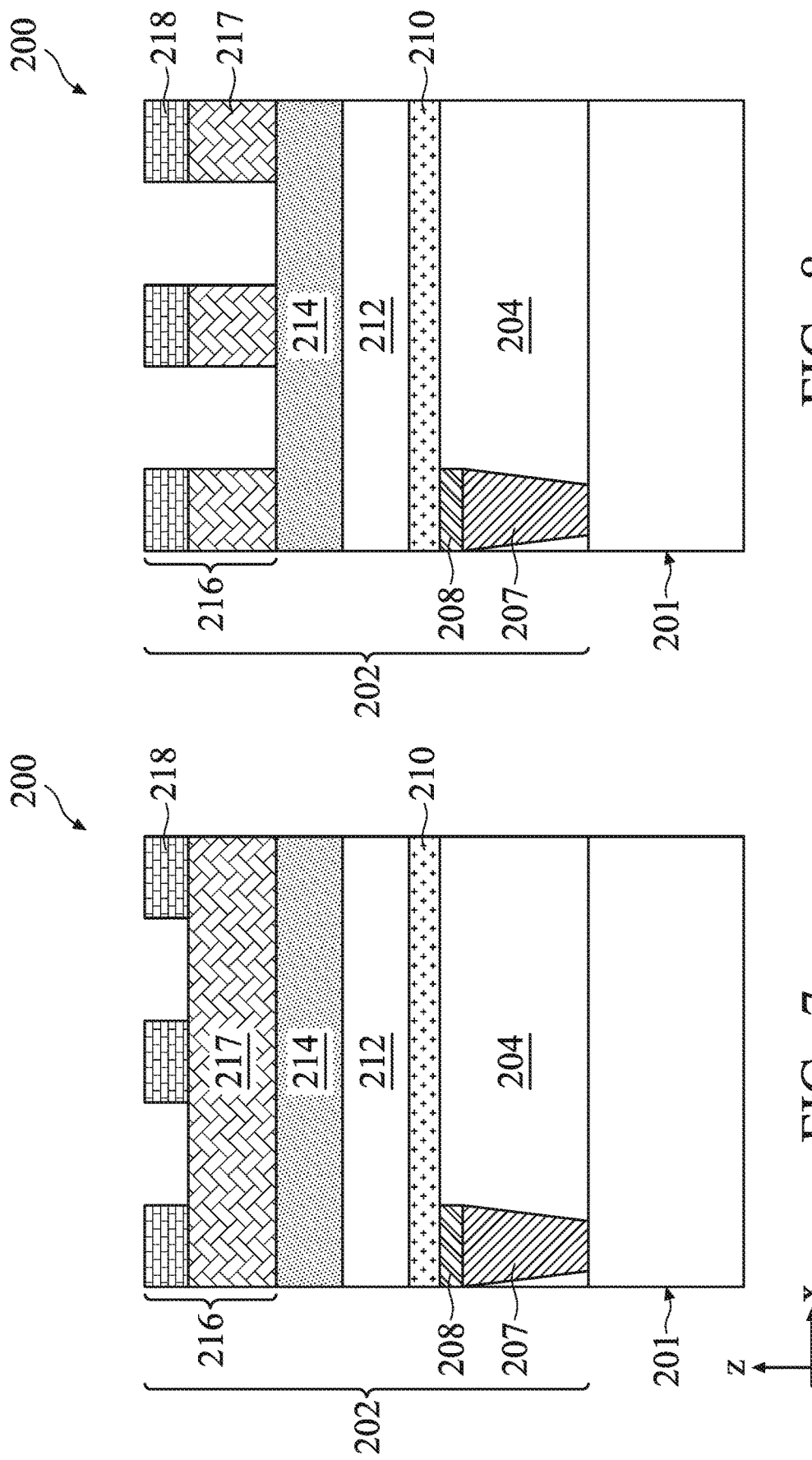

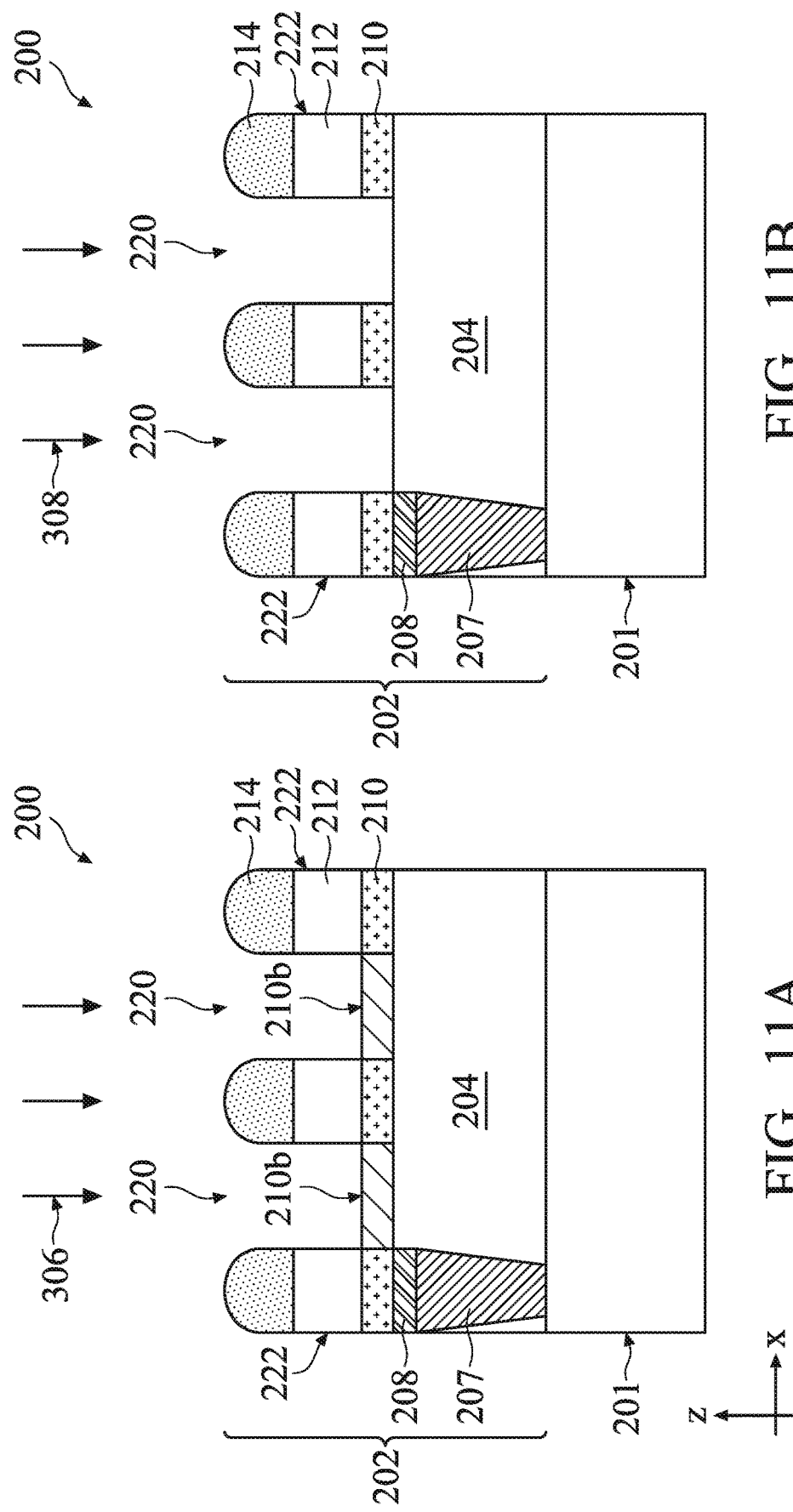

METHODS OF ETCHING METALS IN SEMICONDUCTOR DEVICES

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased.

Production of interconnect structures in ICs with enhanced performance at reduced length scales relies on advanced materials and improved methods of applying these materials. While generally adequate, methods employed for fabricating interconnect structures have not been satisfactory in all aspects when advanced materials are introduced during IC fabrication. For example, gases generally employed for removing a dielectric hard mask layer after forming conductive lines may inadvertently damage underlying dielectric features and/or nearby conductive features. Accordingly, for at least this reason, improvements in methods of forming interconnect structures are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 3A, 3B, 3C, 3D, 4A, 4B, 5, 6, 7, 8, 9, 10, 11A, 11B, 12, 13, 14, and 15 illustrate cross-sectional views of an embodiment of a semiconductor device at various stages of the method depicted in FIGS. 1A and/or 1B according to one or more aspects of the present disclosure.

DETAILED DESCRIPTION

Figure 1A:
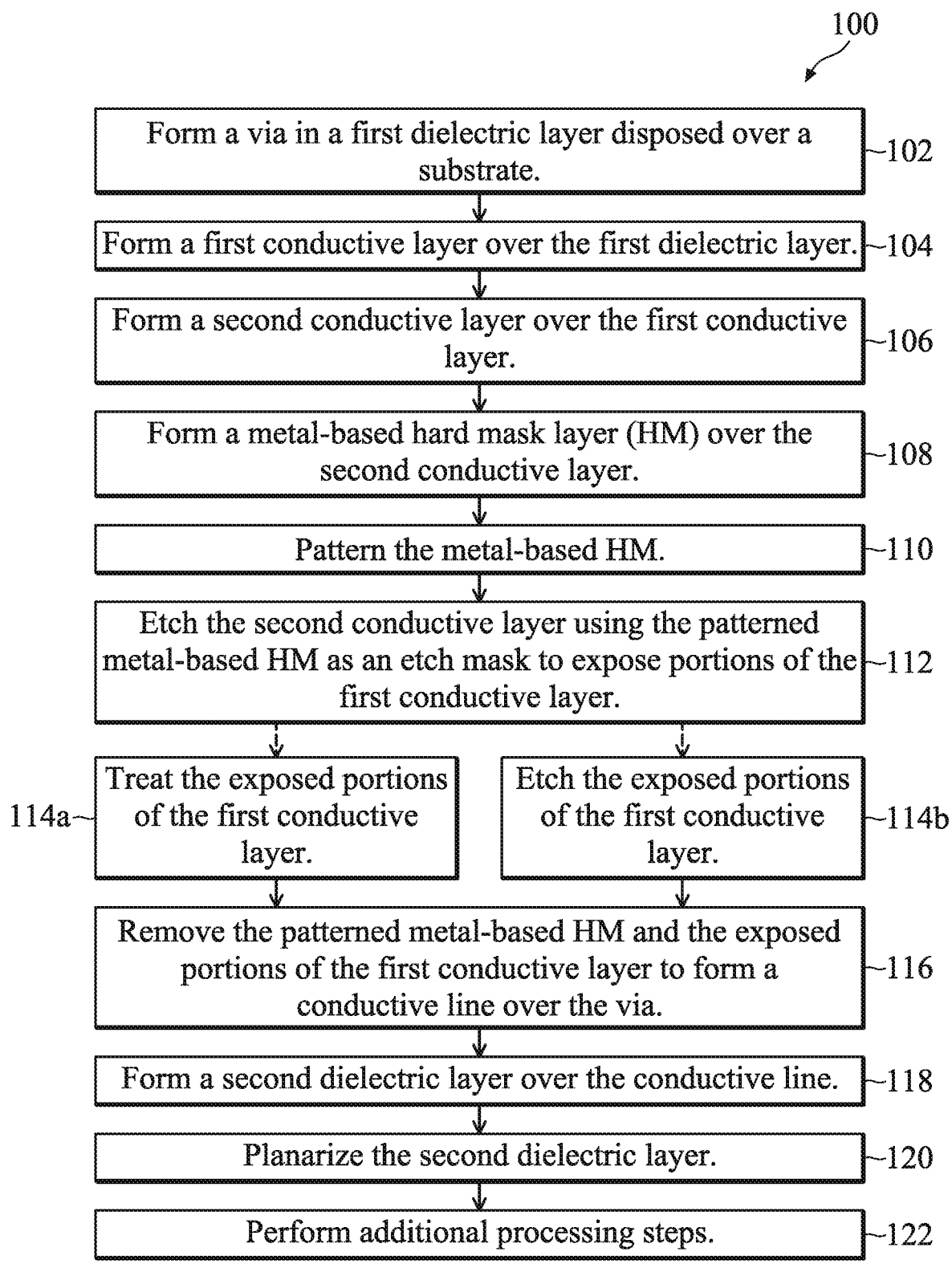
FIG. 1A is a flow chart of a method of fabricating a semiconductor device according to one or more aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Recent development in integrated circuit (IC) fabrication has prompted uses of conductive materials (e.g., Mo, Co, Os, Ir, Nb, Pt, Rh, Re, etc.) capable of being patterned directly to form back-end-of-line (BEOL) interconnect features such as conductive lines. In some examples, forming such conductive lines involves methods of using hard mask layers and etch-stop layers to protect circuit features and/or generally accommodating various fabrication processes. Though such methods have been generally adequate, they have not been satisfactory in all aspects.

Figure 1B:
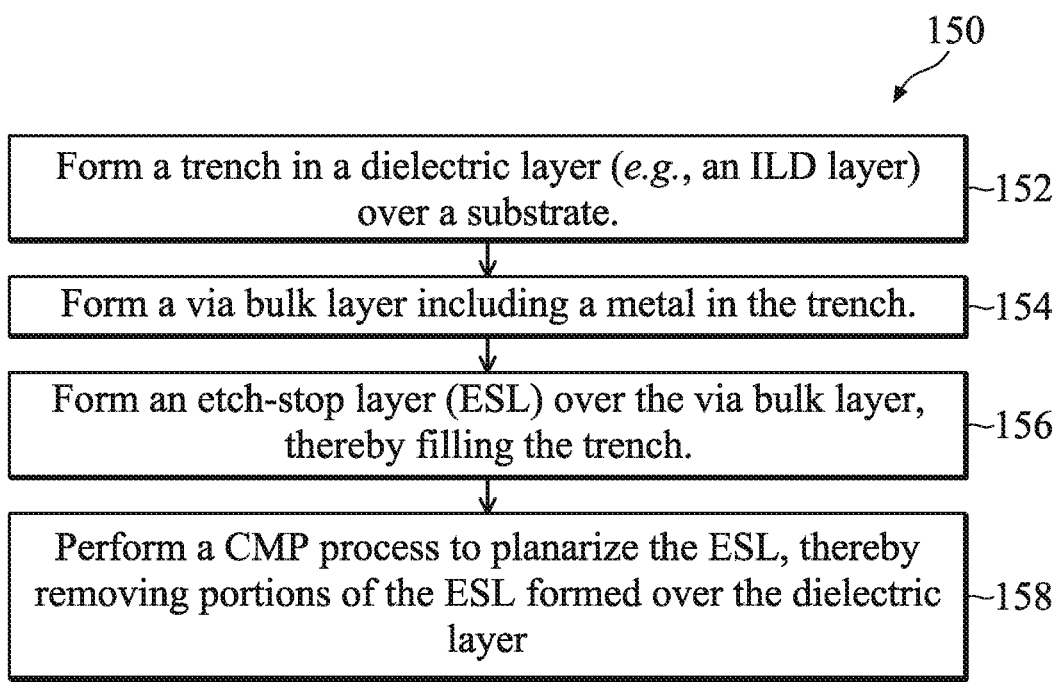
FIG. 1B is a flow chart of a method of fabricating a semiconductor device according to one or more aspects of the present disclosure.

FIG. 1A illustrates a method 100 and FIG. 1B illustrates a method 150 for fabricating a semiconductor device in accordance with one or more of the embodiments described herein. It is understood that the method 100 and the method 150 may each include additional steps performed before, after, and/or during their respective process steps discussed herein. It is also understood that the process steps of the method 100 and the method 150 are merely examples and are not intended to be limiting beyond what is specifically recited in the claims that follow.

FIGS. 2A-15 are cross-sectional views of an embodiment of a semiconductor device 200 (hereafter referred to as device 200) during various stages of an embodiment of the method 100 as depicted in FIG. 1A and/or the method 150 as depicted in FIG. 1B. It is understood that the method 150 may be implemented as an intermediate step of the method 100. It is further understood that the semiconductor device 200 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the embodiments of the present disclosure. In some embodiments, the semiconductor device 200 includes a plurality of semiconductor devices (e.g., transistors), including PFETs, NFETs, etc., which may be interconnected. Moreover, it is noted that the process steps of the method 100 and the method 150, including any descriptions given with reference to FIGS. 2A-15, are merely examples and are not intended to be limiting beyond what is specifically recited in the claims that follow.

Referring to FIGS. 1A and 2A, the method 100 begins at block 102 where a device 200 is provided that includes a structure 202 formed over a structure 201. In some embodiments, the structure 201 includes a number of different components that form a front-end-of-line (FEOL) and middle-end-of-line (MEOL) portions of the device 200 (e.g., a MOSFET), while the structure 202 includes an interconnect structure (e.g., vertical interconnect structures such as vias or horizontal interconnect structures such as conductive lines). Alternatively or additionally, the structure 201 may include an interconnect structure similar to structure 202. It is understood that structure 202 and the structure 201 are not limited in their specific structures and functions within the device 200. For purposes of simplicity the present disclosure is directed to embodiments in which the structure 201 includes FEOL and MEOL components, as depicted in FIG. 2B, and the structure 202 includes a via 206 formed over the structure 201 and configured to electrically connect the structure 201 to additional interconnect structures.

Referring to FIG. 2B, the structure 201 as a portion of the device 200 includes an active region 12 disposed over a semiconductor substrate (hereafter referred to as "substrate") 10 and separated by isolation regions (not depicted). In some embodiments, the substrate 10 may be a semiconductor substrate such as a silicon substrate. The substrate 10 may include various layers, including conductive or insulating layers formed thereon. The substrate 10 may include various doping configurations depending on various design requirements. The substrate 10 may also include other semiconductors such as germanium, silicon carbide (SiC), silicon germanium (SiGe), or diamond. Alternatively, the substrate 10 may include a compound semiconductor and/or an alloy semiconductor. Furthermore, the substrate 10 may optionally include an epitaxial layer (epi-layer), may be strained for performance enhancement, may include a silicon-on-insulator (SOI) structure, and/or have other suitable enhancement features. The isolation regions may include silicon oxide, silicon nitride, silicon oxynitride, fluoride-doped silicate glass (FSG), a low-k dielectric material, and/or other suitable materials. In many embodiments, the isolation regions include shallow trench isolation (STI) features.

In some embodiments, the active region 12 includes a plurality of fins extending away from a top surface of the substrate 10. As such, the active region 12 is configured to provide at least one FinFET, and FIGS. 2A-15 illustrate cross-sectional views of the device 200 along a direction of the fin. Alternatively, the active region 12 may provide planar FETs. The active region 12 may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AnnAs, AlGaAs, InGaAs, GaInP, and/or GaInAsP; or combinations thereof. The active region 12 may be doped with an n-type dopant or a p-type dopant for forming p-type FET and n-type FET, respectively. If including a fin, the active region 12 may be formed using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The device 200 further includes source/drain (S/D) features 16 disposed in the active region 12, a metal gate stack 18 disposed adjacent the S/D features 16, and S/D contacts 22 disposed over the S/D features 16 and in an interlayer dielectric (ILD) layer 20. In many embodiments, the S/D features 16 may be suitable for a p-type FET device (e.g., a p-type epitaxial material) or alternatively, an n-type FET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. The S/D features 16 may be formed by any suitable techniques, such as etching processes followed by one or more epitaxy processes.

Though not depicted, the metal gate stack 18 may include a plurality of material layers, such as a high-k dielectric layer and a gate electrode disposed over the high-k dielectric layer. The metal gate stack 18 may further include other material layers, such as an interfacial layer, barrier layers, hard mask layers, other suitable layers, or combinations thereof. The high-k dielectric layer may include a dielectric material having a high dielectric constant, for example, greater than that of thermal silicon oxide (~3.9). In one example, the high-k dielectric layer may include a high-K dielectric layer such as hafnium oxide ($HfO_2$). The gate electrode may include at least one work-function metal (WFM) layer and a bulk conductive layer. The gate electrode may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. Various layers of the metal gate stack 18 may be formed by any suitable method, such as chemical oxidation, thermal oxidation, atomic layer deposition (ALD), chemical vapor deposition (CVD), physical vapor deposition (PVD), plating, other suitable methods, or combinations thereof. A polishing process (e.g., CMP) may be performed to remove excess materials from a top surface of the metal gate stack to planarize a top surface of the metal gate stack 18.

In various embodiments, the device 200 further includes gate spacers 14 disposed on sidewalls of the metal gate stacks 18. The gate spacers 14 may include a dielectric material, such as silicon oxide, silicon nitride, silicon carbide, silicon oxynitride, other suitable dielectric materials, or combinations thereof. The gate spacers 14 may be formed by first depositing a blanket of spacer material over the device 200, and then performing an anisotropic etching process to remove portions of the spacer material to form the gate spacers 14 on the sidewalls of the metal gate stacks 18.

In many embodiments, the metal gate stacks 18 are formed after other components of the device 200 (e.g., the S/D features 16) are fabricated. Such process is generally referred to as a gate replacement process, which includes forming dummy gate structures (not depicted) as placeholders for the metal gate stacks 18, forming the S/D features 16, forming the ILD layer 20 (and optionally an etch-stop layer, or ESL, such as ESL 24) over the dummy gate structures and the S/D features 16, planarizing the ILD layer 20 by, for example, a CMP process, to expose a top surface of the dummy gate structures, removing the dummy gate structures in the ILD layer 20 to form trenches in the active region 12, and forming the metal gate stacks 18 in the trenches to complete the gate replacement process. In some embodiments, the ILD layer 20 includes a low-k dielectric material (e.g., doped silicon oxide), fused silica glass (FSG), phosphosilicate glass (PSG), borophospohosilicate glass (BPSG), other suitable dielectric materials, or combinations thereof. In the depicted embodiment, the ILD layer 20 includes a porous low-k dielectric material, which is understood to be a dielectric material having a dielectric constant less than that of silicon oxide. The ILD layer 20 may include a multi-layer structure having multiple dielectric materials and may be formed by a deposition process such as, for example, CVD, flowable CVD (FCVD), spin-on-glass (SOG), other suitable methods, or combinations thereof. The ESL 24 may comprise silicon carbide, aluminum oxide, aluminum oxynitride, dense carbon-doped silicon oxide (porosity of approximately 0%), silicon nitride, silicon oxynitride, silicon nitride with oxygen or carbon elements, other suitable materials, or combinations thereof, and may be formed by CVD, PVD, ALD, other suitable methods, or combinations thereof.

The device 200 further includes S/D contacts 22 disposed in the ILD layer 20 and physically contacting the S/D features 16. The S/D contacts 22 are configured to connect the S/D features 16 with subsequently formed interconnect structures (i.e., the structure 202), such as vias and conductive lines (e.g., the structure 202 as discussed above), over the device 200. In many embodiments, the S/D contacts 22 includes a conductive material such as Cu, W, Ru, Mo, Al, Co, Ni, Mn, Ag, other suitable conductive materials, or combinations thereof. The S/D contacts 22 may be formed by first patterning the ILD layer 20 (and the ESL 24) to form trenches (not depicted) that expose the S/D features 16, and depositing the conductive material by CVD, PVD, ALD, plating, other suitable methods, or combinations thereof to form the S/D contacts 22. The patterning of the ILD layer 20 may include forming a masking element (not depicted) over the ILD layer 20, where the masking element includes a lithographic resist material (e.g., a photoresist layer) configured to undergo chemical changes when exposed to a radiation source (e.g., an extreme ultraviolet, or EUV, source) through a lithographic mask or reticle. After being subjected to radiation exposure, the masking element may then be developed (followed by an optional baking process) to transfer the pattern on the lithography mask onto the masking element. The patterned masking element may then be used as an etch mask to form an opening in the ILD layer 20, after which the patterned masking element is removed by any suitable method such as wet etching or plasma ashing. Thereafter, a conductive material including Cu, W, Ru, Mo, Al, Co, Ni, Mn, Ag, other suitable conductive materials, or combinations thereof is deposited in the opening by any suitable method, such as CVD or plating, followed by one or more CMP process to form the S/D contacts 22.

As depicted in FIG. 2A, the structure 202 includes an ILD layer 204 disposed over the structure 201. In many embodiments, the ILD layer 204 is substantially similar to the ILD layer 20 in composition and may be formed by any suitable method as discussed above. For example, the ILD layer 204 includes a porous low-k dielectric material such as a doped silicon oxide. Still referring to FIGS. 1A and 2A, the method 100 at block 102 forms the via 206 in the ILD layer 204, where the via 206 interconnects the S/D contact 22 to additional interconnection features formed in subsequent processes discussed herein.

Figure 3D:
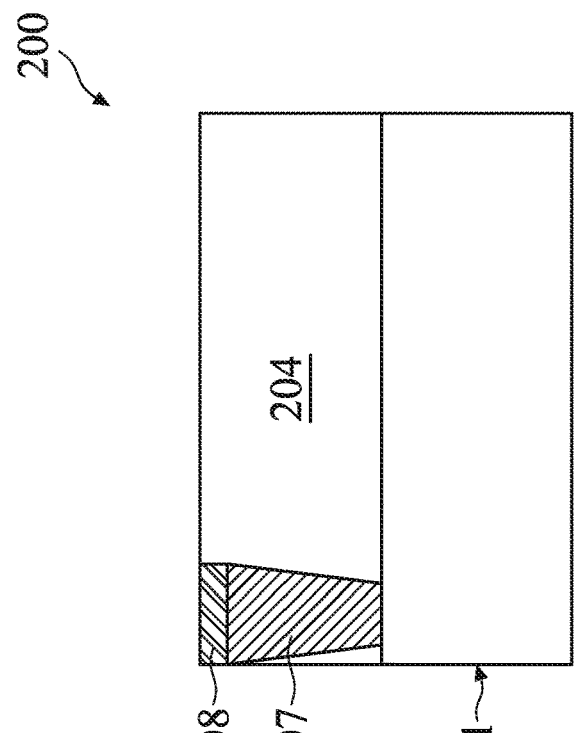
Figure 3C:
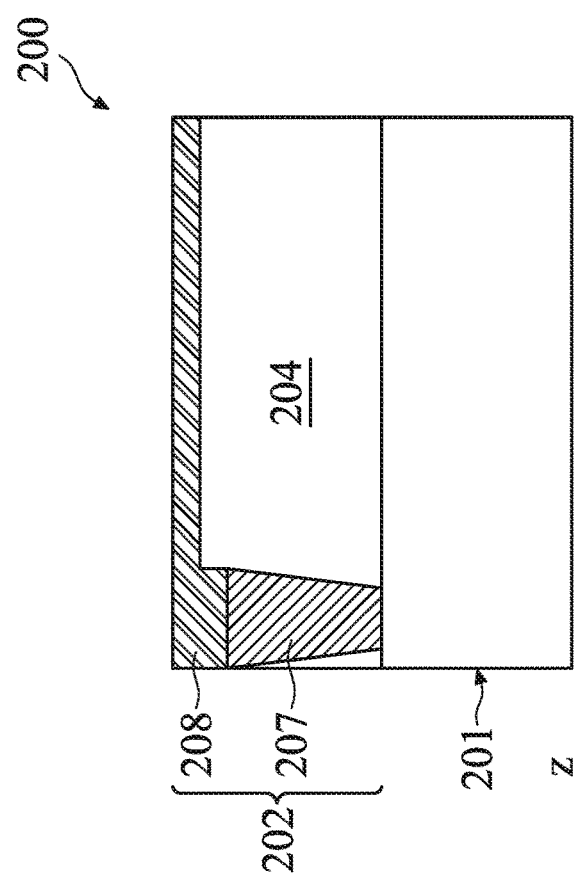

The method 100 may form the via 206 in any suitable method including, for example, the method 150 depicted and discussed below with reference to FIGS. 1B and 3A-3D. Referring to FIGS. 1B and 3A, the method 150 at block 152 forms a trench 203 in the ILD layer 204 to expose portions (e.g., the S/D contact 22) of the underlying structure 201. In some examples, the method 150 may form the trench 203 by first patterning the ILD layer 204 in a process similar to the patterning of the ILD layer 20 as discussed above. Thereafter, referring to FIGS. 1B and 3B, the method 150 at block 154 forms a via bulk layer 207 in the trench 203 by depositing a conductive material (e.g., Cu, W, Ru, Mo, Al, Co, Ni, Mn, Ag, other suitable conductive materials, or combinations thereof) by CVD, PVD, ALD, plating, other suitable methods, or combinations thereof. Notably, the via bulk layer 207 does not completely fill the trench 203 but only occupies about 90% to about 95% of the volume of the trench 203. Referring to FIGS. 1B and 3C, the method 150 at block 156 subsequently deposits a conductive ESL 208 over the via bulk layer 207 to fill the trench 203. The conductive ESL 208 includes a metal or metal-based compound such as Co, Ru, Ta, Ti, tantalum nitride, titanium nitride, other suitable materials, or combinations thereof. In some embodiments, the conductive ESL 208 is configured to protect the via bulk layer 207 from inadvertent damage during subsequent processing steps (e.g., overlay errors during a subsequent patterning process). As such, the conductive ESL 208 has a composition different from that of the via bulk layer 207. Thereafter, referring to FIGS. 1B and 3D, the method 150 at block 158 performs one or more CMP process to planarize a top surface of the device 200 such that portions of the conductive ESL 208 formed over the ILD layer 204 are removed.

Figure 4B:
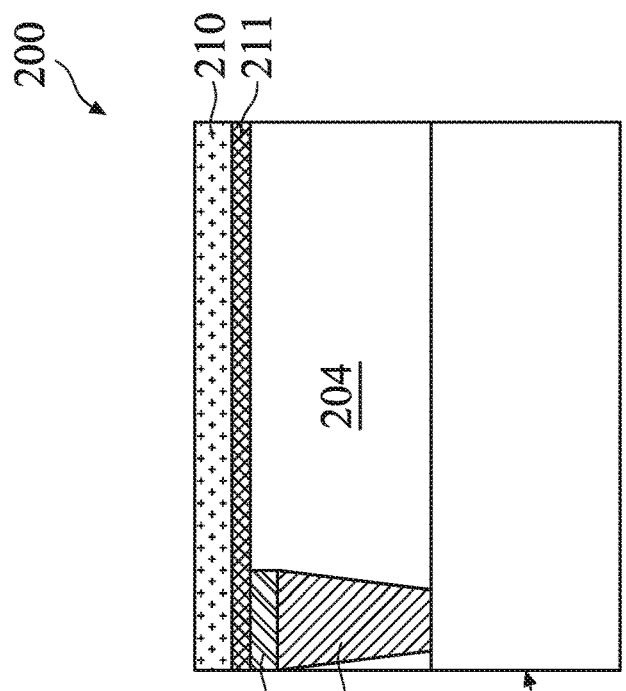
Figure 4A:
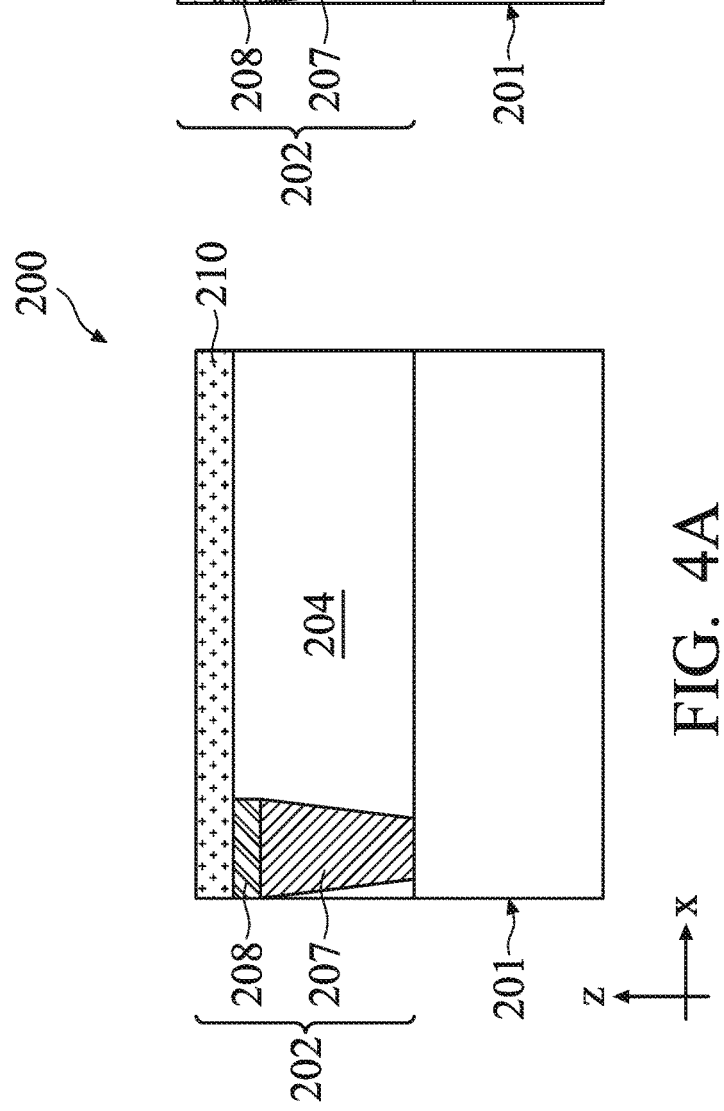

Referring to FIGS. 1A and 4A, the method 100 at block 104 forms a conductive layer 210 over the ILD layer 204. In the present embodiments, the conductive layer 210 includes one or more metals such as Cu, Cr, Ru, Ti, V, Pd, In, their respective alloys, or combinations thereof. In some embodiments, the conductive layer 210 includes titanium nitride. In some embodiments, the conductive layer 210 is free of tantalum nitride, which is susceptible to chemical etching (i.e., chemically etchable) by a fluorine-containing gas. The conductive layer 210 may be formed by ALD, PVD, or a combination thereof. In some examples, the conductive layer 210 is formed to a thickness of about 10 Angstroms to about 50 Angstroms, the significance of which will be discussed in detail below. Notably, the conductive layer 210 is substantially resistant to chemical etching by a fluorine-containing gas. As a result, the conductive layer 210 may function as an etch-stop layer by providing sufficient etching selectivity with respect to subsequently formed material layers as discussed in detail below. Furthermore, in the present embodiments, the conductive layer 210 has a composition different from that of the conductive ESL 208.

In some examples, referring to FIG. 4B, a barrier layer 211 may be formed over the ILD layer 204 before forming the conductive layer 210 to improve adhesion between the conductive layer 210 and the underlying ILD layer 204. The barrier layer 211 may include Ta, Ti, tantalum nitride, titanium nitride, other suitable materials, or combinations thereof. The barrier layer 211 may be formed by PVD, ALD, or a combination thereof, and may be formed to a thickness of about 10 Angstroms to about 30 Angstroms, for example. Of course, other dimensions may also be applicable in the present embodiments. In some embodiments, the conductive layer 210 and the barrier layer 211 include different compositions. For example, the conductive layer 210 includes Cu, Ru, or a combination thereof, while the barrier layer 211 includes Ta, tantalum nitride, or a combination thereof.

Figure 5:
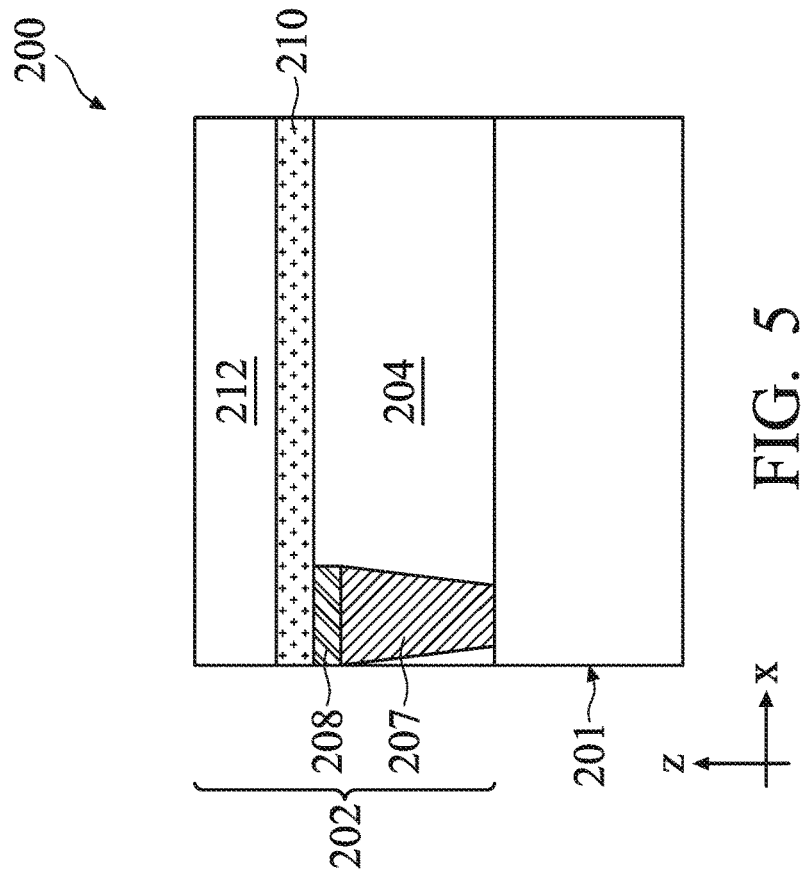

Referring to FIGS. 1A and 5, the method 100 at block 106 forms a conductive layer 212 over the conductive layer 210. In the present embodiments, the conductive layer 212 is subsequently processed to provide horizontal interconnect structures (e.g., conductive lines) for the device 200. The conductive layer 212 includes one or more metals such as Mo, Os, Jr, Co, Nb, Pt, Rh, Re, their respective alloys, or combinations thereof, and has a distinctly different composition from the conductive layer 210. For example, the conductive layer 212 is free of metals such as Cu, Cr, Ru, Ti, V, Pd, In, their respective alloys, or combinations thereof. Additionally, the conductive layer 212 does not, or does not substantially, include any non-metallic elements such as, for example, O, N, C, other non-metallic elements, or combinations thereof. Such difference in composition between the conductive layers 210 and 212 affords the etching selectivity between the two layers, which is at least about 10 in the present embodiments. Still different from the conductive layer 210, the conductive layer 212 is substantially susceptible to chemical etching (i.e., chemically etchable) by a fluorine-containing gas, i.e., the conductive layer 212 is patternable by a dry etching process that employs a fluorine-containing gas as an etchant.

The conductive layer 212 may be formed by PVD, ALD, plating, other suitable methods, or combinations thereof. In some examples, the conductive layer 212 is formed by a different deposition process from the conductive layer 210 as it is generally formed to a greater thickness than the conductive layer 210. For example, the conductive layer 212 is formed to a thickness of about 200 Angstroms to about 500 Angstroms, significantly greater than the thickness of the conductive layer 210 as discussed herein. In the present embodiments, such arrangement is intended for improving pattern resolution (e.g., reducing line-width roughness) during subsequent etching processes. In some examples, a ratio of the thickness of the conductive layer 210 to the thickness of the conductive layer 212 is about 1:20 to about 1:10. Notably, the conductive layer 212 may be deposited directly over the conductive layer 210 without needing a barrier layer (or a glue layer) disposed thereunder.

In contrast to damascene processes (i.e., trench forming followed by deposition and planarization) generally employed for forming conductive lines, metals (e.g., Mo, Os, Jr, Co, Nb, Pt, Rh, Re, their respective alloys, or combinations thereof) included in the conductive layer 212 are directly patternable, i.e., capable of being etched directly to form a conductive line, thereby reducing processing cost and complexity. Furthermore, when a fluorine-containing gas is applied to etch the conductive layer 212, generally desirable features such as vertical pattern profiles and easily removable volatile etching byproduct may be expected. However, absent a suitable etch-stop layer and means of removing hard mask layers (e.g., hard mask layer 214 discussed below), dielectric features in the vicinity of the conductive layer 212 may suffer unintentional damage when a fluorine-containing etchant is utilized. For example, the fluorine-containing etchant may inadvertently recess portions of an ILD layer (e.g., the ILD layer 204 and/or any circuit features disposed therein such as the via 206) when patterning the conductive layer 212. Furthermore, general methods (e.g., dry etching) of removing dielectric hard mask layers may also damage the ILD layer, potentially compromising integrity of the device performance. Accordingly, the present disclosure contemplates methods of reducing inadvertent damage to dielectric components due to the use of fluorine-containing etchant when patterning conductive materials such as those included in the conductive layer 212.

Figure 6:
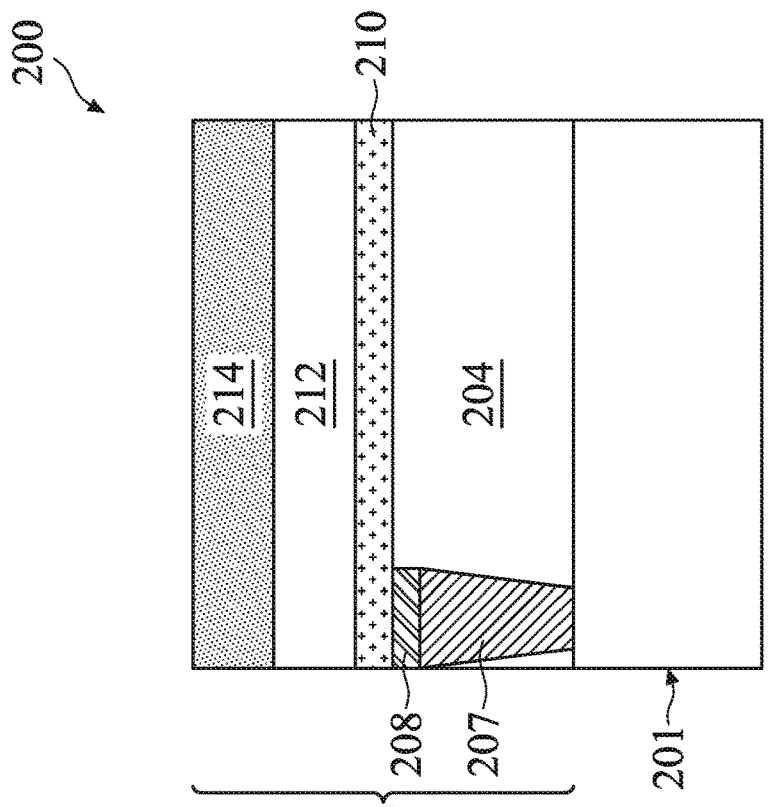

Referring to FIGS. 1A and 6, the method 100 at block 108 forms a metal-based hard mask layer 214 over the conductive layer 212. In the present embodiments, the hard mask layer 214 is substantially resistant to chemical etching by a fluorine-containing gas and is configured to be removable by a wet etchant including peroxide ($H_2O_2$), sulfuric acid ($H_2SO_4$), hydrofluoric acid (HF), hydrochloric acid (HCl), vinylhydroperoxide ($CH_2CHOOH$), phosphoric acid ($H_3PO_4$), nitric acid ($HNO_3$), ammonia ($NH_3$), deionized water (DI $H_2O$), other suitable wet agents, or combinations thereof. The hard mask layer 214 may include Al, titanium nitride, tantalum nitride, aluminum nitride, aluminum oxide, ruthenium oxide, other suitable materials, or combinations thereof. In the present embodiments, the hard mask layer 214 includes a metal distinctly different from that included in the conductive layer 212, i.e., the hard mask layer 214 is free of metals such as Mo, Os, Jr, Co, Nb, Pt, Rh, Re, their respective alloys, or combinations thereof. In some embodiments, the hard mask layer 214 is substantially susceptible to chemical etching (i.e., chemically etchable) by a chlorine-containing gas.

The hard mask layer 214 may be formed by ALD, PVD, other suitable methods, or combinations thereof, to a thickness of about 50 Angstroms to about 200 Angstroms. In some embodiments, the hard mask layer 214 has a thickness that is less than that of the conductive layer 212 in order to maintain a low aspect ratio when etching the conductive layer 212 in a subsequent processing step. In some examples, a ratio of the thickness of the hard mask layer 214 to the thickness of the conductive layer 212 is about 1:10 to about 1:2. In the present embodiments, a high etching selectivity between the conductive layer 212 and the hard mask layer 214 allows the hard mask layer 214 to be formed to a thickness less than that of the conductive layer 212. In one example, the etching selectivity between the conductive layer 212 and the hard mask layer 214 is at least 8.

Now referring to FIGS. 1A and 7-9, the method 100 at block 110 patterns the hard mask layer 214. As depicted in FIGS. 7 and 8, the method 100 first forms and patterns a masking element 216 that includes at least a resist layer 218 disposed over a bottom layer 217. In some embodiments, the bottom layer 217 is an anti-reflective coating (ARC) and the resist layer 218 includes a lithographic resist (e.g., a photoresist) material configured to undergo chemical changes when exposed to a radiation source (e.g., an extreme ultraviolet, or EUV, source) through a lithographic mask or reticle. After being subjected to radiation exposure, referring to FIG. 7, the resist layer 218 may then be developed (followed by an optional baking process) to transfer a pattern of the lithography mask onto the masking element 216. The resist layer 218 may then be used to pattern the bottom layer 217 with a suitable etching process (e.g., a dry etching process) as depicted in FIG. 8, thereby forming a patterned masking element 216. In some examples, the bottom layer 217 may be etched by a plasma including a chlorine-containing gas (e.g., $Cl_2$, $SiCl_4$, $BCl_3$, other chlorine-containing gases, or combinations thereof), a bromine-containing gas (e.g., HBr), a nitrogen-containing gas (e.g., $N_2$), an oxygen-containing gas (e.g., $O_2$), a hydrogen-containing gas (e.g., $H_2$), an inert gas (e.g., He, Ne, Ar, Kr, or combinations thereof), or combinations thereof. In some embodiments, the bottom layer 217 is etched by a plasma including $O_2$ as a major component and $Cl_2$ as a minor component.

Figures 9, 10:
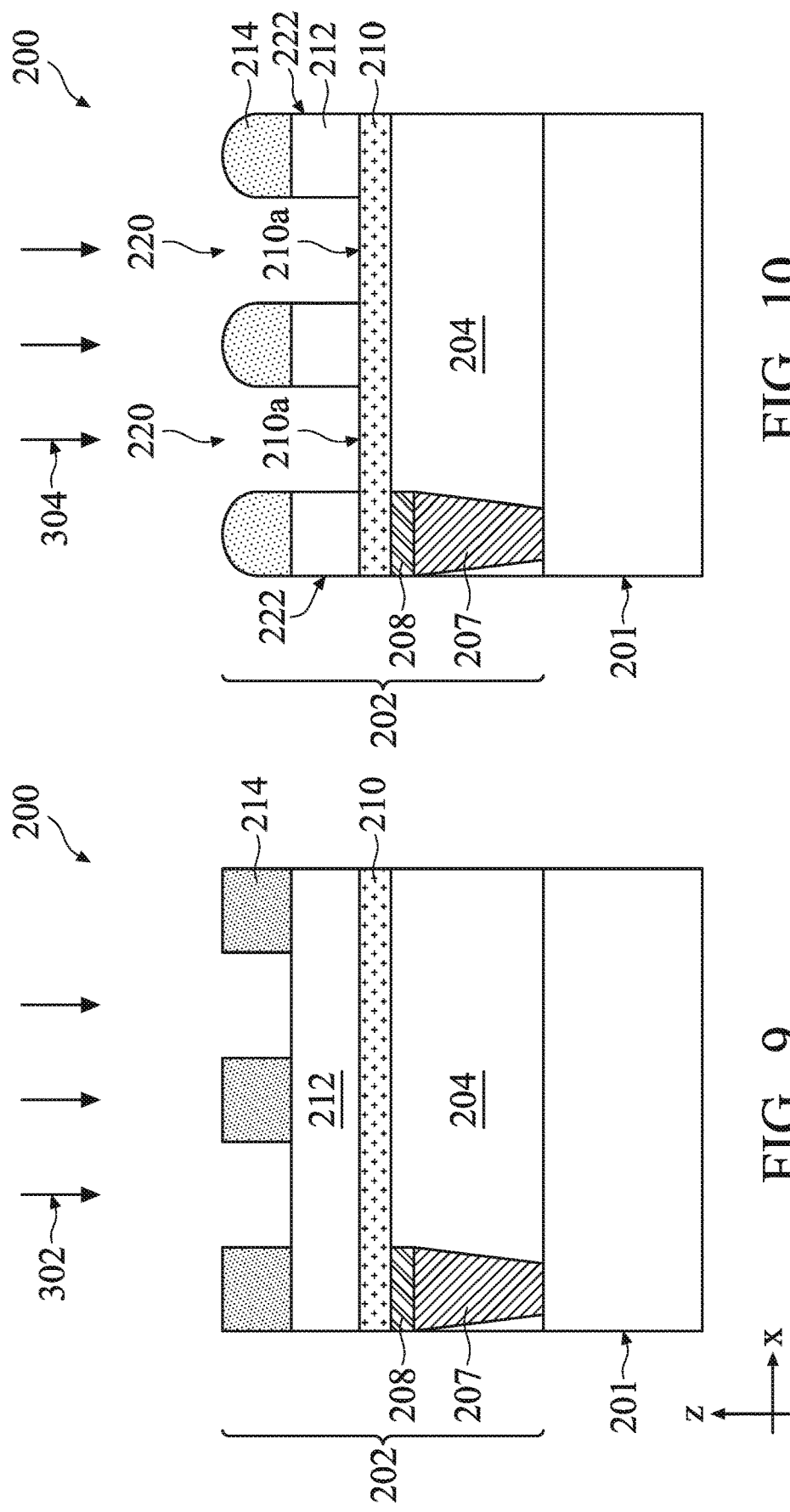

Referring now to FIG. 9, the patterned masking element 216 is subsequently used as an etch mask to transfer the pattern to the hard mask layer 214 in an etching process 302.

In the present embodiments, the etching process 302 is a dry etching process (e.g., a reactive ion etching, or RIE, process) that implements an etchant including a chlorine-containing gas (e.g., $Cl_2$, $SiCl_4$, $BCl_3$, other chlorine-containing gases, or combinations thereof), a bromine-containing gas (e.g., HBr), a nitrogen-containing gas (e.g., $N_2$), an oxygen-containing gas (e.g., $O_2$), a hydrogen-containing gas (e.g., $H_2$), a carbon-containing gas (e.g., CO), an inert gas (e.g., He, Ne, Ar, Kr, or combinations thereof), or combinations thereof. Notably, in order to protect the exposed potions of the conductive layer 212 from being damaged when patterning the hard mask layer 214, the etching process 302 implements an etchant that is free or substantially free (e.g., including less than 1 ppm) of a fluorine-containing gas. In some examples, the etching process 302 is implemented using transformer coupled plasma (TCP) at a power of about 100 W to about 2000 W and a bias voltage of less than about 800 V. Of course, other etching conditions may also be applicable to the present embodiments. The patterned masking element 216 is subsequently removed from the device 200 by a resist stripping or plasma ashing.

Referring to FIGS. 1A and 10, the method 100 at block 112 etches the conductive layer 212 to form trenches 220 in an etching process 304 using the patterned hard mask layer 214 as an etch mask, thereby exposing portions of the conductive layer 210. As a result, the method 100 at block 112 forms conductive lines 222 separated by the trenches 220. Specifically, the etching process 304 selectively removes portions of the conductive layer 212 without removing or substantially removing portions of the conductive layer 210. In the present embodiments, the etching process 304 is a dry etching process that implements a plasma including at least a fluorine-containing gas such as $CF_4$, $CHF_3$, $CH_3F$, $CH_2F_2$, $C_4F_8$, $C_4F_6$, other fluorine-containing gases, or combinations thereof. In some embodiments, the etchant further includes a bromine-containing gas (e.g., HBr), a nitrogen-containing gas (e.g., $N_2$), an oxygen-containing gas (e.g., $O_2$), a hydrogen-containing gas (e.g., $H_2$), a carbon-containing gas (e.g., CO), an inert gas (e.g., He, Ne, Ar, Kr, or combinations thereof), or combinations thereof. In some examples, the etching process 304 is implemented using TCP at a power of about 100 W to about 2000 W and a bias voltage of less than about 800 V. Of course, other etching conditions may also be applicable to the present embodiments.

In the present embodiments, the etching process 304 implements a plasma that is free or substantially free (e.g., including less than 1 ppm) of any chlorine-containing gas, such that the hard mask layer 214 and the conductive layer 210 are not etched or substantially etched. As discussed above, compositions of the conductive layer 210, the conductive layer 212, and the hard mask layer 214 are chosen to ensure that high etching selectivity is achieved between them. For example, because metals included in the conductive layer 212 are substantially susceptible to chemical etching (i.e., chemically etchable) by a fluorine-containing gas, both the conductive layer 210 and the hard mask layer 214 are configured to be substantially resistant to chemical etching by a fluorine-containing gas. It is still possible, however, that during the etching process 304 corners of the hard mask layer 214 may be damaged by the plasma due to molecular bombardment (rather than chemical etching) and become rounded as depicted in FIG. 10.

The method 100 may subsequently proceed to one of two operations independently or sequentially as depicted by FIGS. 11A and 11B. Referring to FIGS. 1A and 11A, the method 100 at block 114a applies a treatment 306 to portions 210a of the conductive layer 210 exposed by the trenches 220. The treatment 306 implements a plasma that includes an inert gas (e.g., He, Ne, Ar, Kr, or combinations thereof). In some examples, the treatment 306 may be implemented using TCP at a power of about 100 and 2000 W and a bias voltage of less than 800 W. Of course, other etching conditions may also be applicable to the present embodiments. In the present embodiments, physical bombardment by the inert gas molecules, together with the conductive layer 210's thin structure, causes the exposed portions 210a of the conductive layer 210 to become porous and forms treated portions 210b. In other words, the treatment 306 compromises the structural integrity of the treated portions 210b of the conductive layer 210, enabling the treated portions 210b to be removable by a wet etching process discussed in detail below.

Alternatively or sequentially, referring to FIGS. 1A and 11B, the method 100 at block 114b applies an etching process 308 to remove the exposed portions 210a from the device 200. The etching process 308 is a dry etching process that implements a plasma including a bromine-containing gas (e.g., HBr), a nitrogen-containing gas (e.g., $N_2$), an oxygen-containing gas (e.g., $O_2$), a hydrogen-containing gas (e.g., $H_2$), a carbon-containing gas (e.g., CO), an inert gas (e.g., He, Ne, Ar, Kr, or combinations thereof), other suitable gases, or combinations thereof. Notably, the etching process 308 implements a plasma that is substantially free of any chlorine-containing gas and fluorine-containing gas so as to protect both the patterned hard mask layer 214 and the patterned conductive layer 212 (i.e., the conductive lines 222) from being damaged. In the present embodiments, the operation at block 114b deepens the trenches 220 to expose the underlying ILD layer 204. In other words, the conductive layer 210 is patterned by the etching process 308 using the patterned conductive layer 212 (and the patterned hard mask layer 214) as an etch mask.

Figure 12:
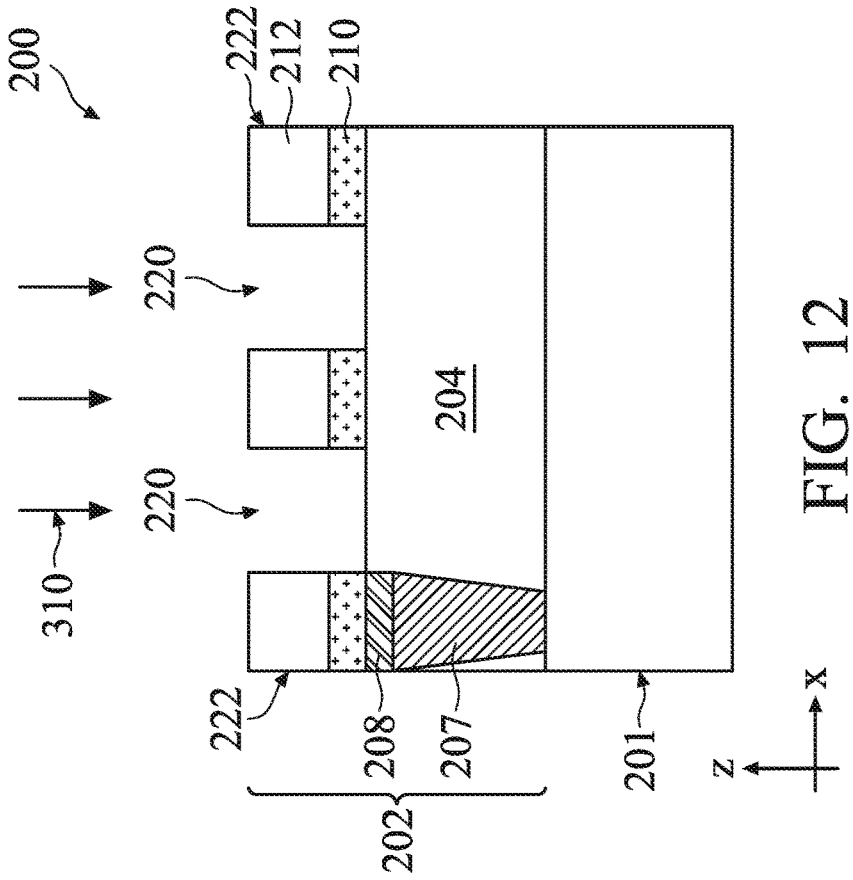
Figure 15:
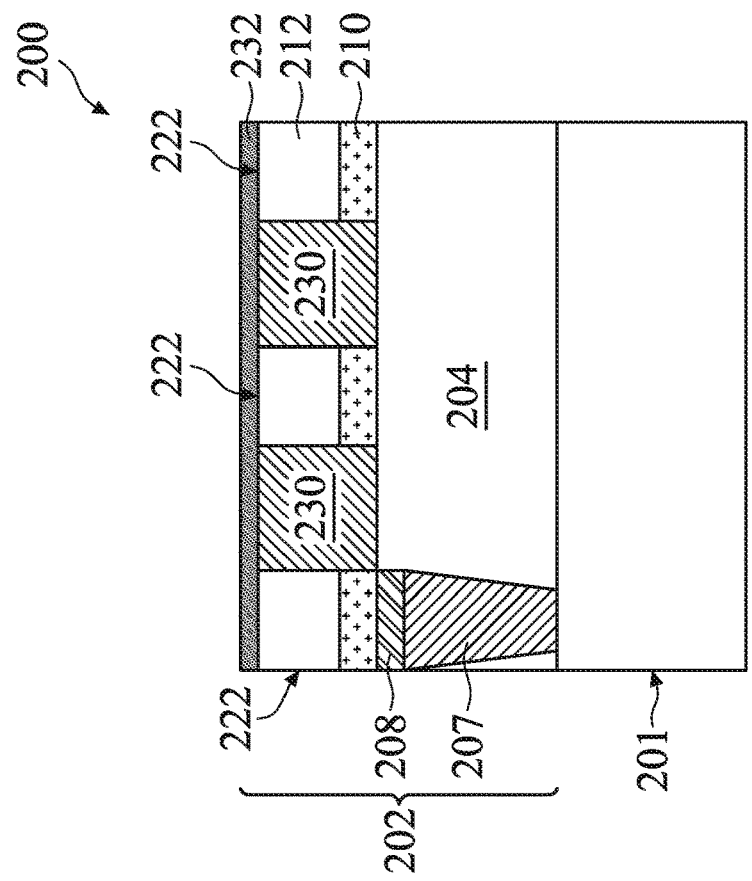

Thereafter, referring to FIGS. 1A and 12, the method 100 at block 116 removes the patterned hard mask layer 214 from the device 200 by an etching process 310. The etching process 310 is a wet etching process that implements a wet etchant including peroxide ($H_2O_2$), sulfuric acid ($H_2SO_4$), hydrofluoric acid (HF), hydrochloric acid (HCl), vinylhydroperoxide ($CH_2CHOOH$), phosphoric acid ($H_3PO_4$), nitric acid ($HNO_3$), ammonia ($NH_3$), deionized water (DI $H_2O$), other suitable wet agents, or combinations thereof. In some embodiments, because of the compromised structure of the treated portions 210b, removing the patterned hard mask layer 214 also removes the treated portions 210b of the conductive layer 210. In some embodiments, removing the patterned hard mask layer 214 removes any etching by-product left behind by the etching process 308 as discussed above with respect FIG. 11B.

Notably, though the hard mask layer 214 may be patterned by a dry etching process at block 110, removing such layer using a similar dry etching process would inadvertently recess the underlying ILD layer 204 causing damage to the via 206 and/or damage the structures of the conductive lines 222 resulting in the conductive lines with rounded profiles. To circumvent such shortcomings, a metal-based material is chosen for forming the hard mask layer 214 such that the hard mask layer 214 may be removed by a wet etchant to ensure adequate etching selectivity with respect to the ILD layer 204 as well as to avoid bombarding the conductive lines 222 with high-energy gas molecules during the removal process.

Figure 13:
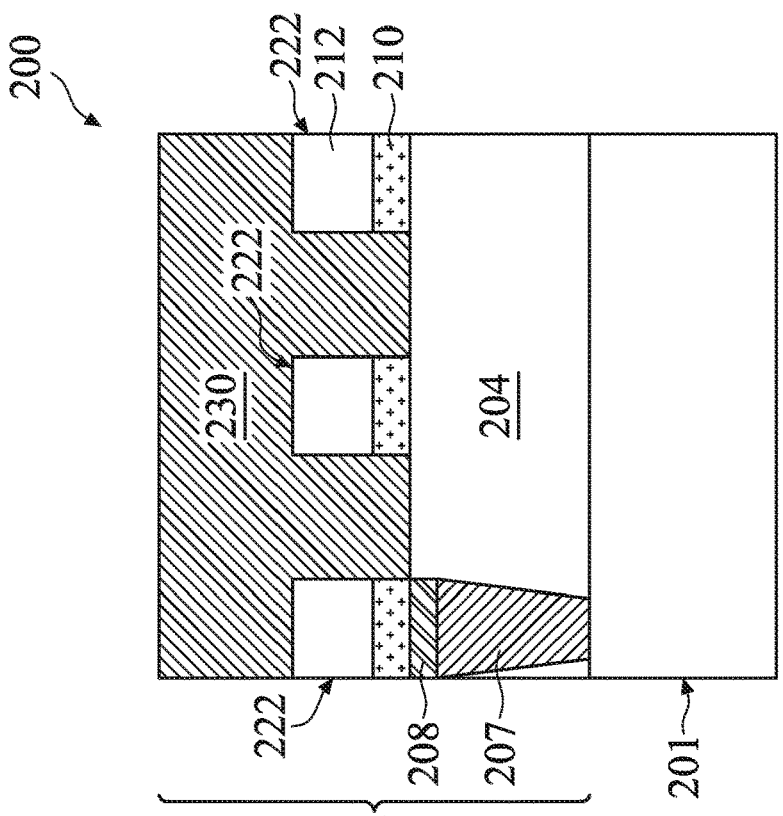
Figure 14:
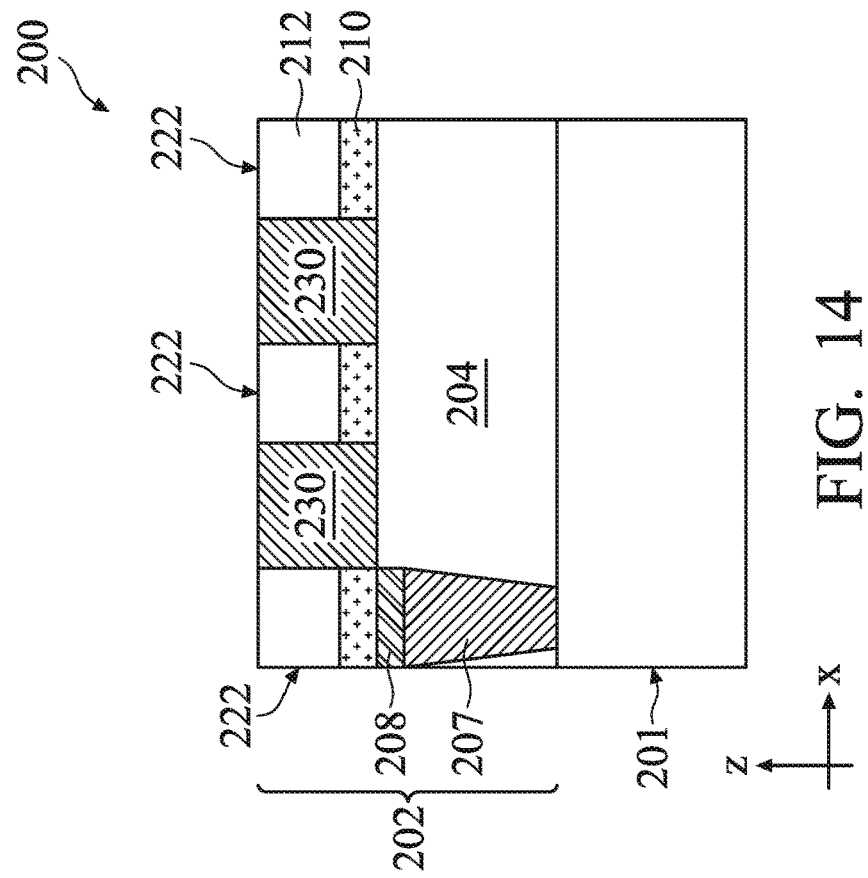

Referring to FIGS. 1A and 13, the method 100 at block 118 forms an ILD layer 230 over the conductive lines 222, thereby filling the trenches 220. The ILD layer 230 may be similar to the ILD layer 20 as discussed above and may be formed by CVD, FCVD, SOG, other suitable methods, or combinations thereof. Referring to FIGS. 1A and 14, the method 100 at block 120 performs a CMP process to planarize the device 200 such that portions of the ILD layer 230 formed over a top surface of the conductive lines 222 are removed. Thereafter, referring to FIGS. 1A and 15, the method at block 122 performs additional processing steps to the device 200. For example, the method 100 may deposit an ESL 232 over the device 200. The ESL 232 may include a dielectric material such as aluminum oxide, aluminum nitride, silicon nitride, silicon carbide, silicon oxynitride, other suitable materials, or combinations thereof, and may be deposited by ALD, CVD, other suitable methods, or combinations thereof. Thereafter, additional interconnect features (e.g., vias and/or conductive lines) and dielectric features (e.g., ILD layers) may be formed over the device 200.

Embodiments of the present disclosure provide methods of forming interconnect structures in semiconductor structures having improved performance and processability. While some advantages of the present embodiments have been described, other advantages of using one or more of the present embodiments may be present and no particular advantage is required for the embodiments described in the present disclosure. In one example, present embodiments provide direct patterning of conductive lines while minimizing damage to underlying dielectric layer (e.g., ILD layers) by use of a conductive etch-stop layer having enhanced etching selectivity with respect to a composition of the conductive lines. In another example, present embodiments provide methods of removing a patterned hard mask layer formed over the conductive lines using a wet etching process, thereby providing better etching selectivity to protect the conductive lines from potential damage incurred by the removal process.

In one aspect, the present disclosure provides a method that includes forming a via in a first dielectric layer, which is disposed over a semiconductor substrate, forming a first metal layer over the first dielectric layer, followed by forming a second metal layer over the first metal layer, where a composition of the second metal layer is different from a composition of the first metal layer. Subsequently, the method proceeds to patterning the hard mask layer and etching the second metal layer using the patterned hard mask layer as an etch mask to form a conductive line, thereby exposing a portion of the first metal layer. The method then proceeds to removing the patterned hard mask layer from the conductive line in a wet etching process, where the removing removes the exposed portion of the first metal layer, and subsequently forming a second dielectric layer over the conductive line.

In another aspect, the present disclosure provides a method that includes depositing an ESL that includes a first metal over an ILD layer, where a via is embedded in the ILD layer, forming a metal layer including a second metal over the ESL, and depositing a hard mask (HM) that includes a third metal over the metal layer. The method then proceeds to performing a first dry etching process to pattern the HM, performing a second dry etching process to pattern the metal layer using the patterned HM as an etch mask, thereby exposing portions of the ESL layer, and subsequently performing a wet etching process to remove the patterned HM.

In yet another aspect, the present disclosure provides a semiconductor structure that includes a conductive feature disposed over a semiconductor substrate, a via disposed in a first ILD layer over the conductive feature, and a metal-containing ESL disposed on the via, where the metal-containing ESL includes a first metal and is resistant to etching by a fluorine-containing etchant. The semiconductor structure further includes a conductive line disposed over the metal-containing ESL, where the conductive line includes a second metal different from the first metal and is etchable by the fluorine-containing etchant, and where the via is configured to interconnect the conductive line to the conductive feature. Furthermore, the semiconductor structure includes a second ILD layer disposed over the first ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a via in a first dielectric layer disposed over a semiconductor substrate;
forming a first metal layer over the first dielectric layer;
forming a second metal layer over the first metal layer, wherein a composition of the second metal layer is different from a composition of the first metal layer;
forming a hard mask layer over the second metal layer;
patterning the hard mask layer;
etching the second metal layer using the patterned hard mask layer as an etch mask to form a conductive line, wherein the etched second metal layer exposes a portion of the first metal layer;
treating the exposed portion of the first metal layer with a plasma;
removing both the patterned hard mask layer and the treated exposed portion of the first metal layer in a wet etching process, thereby exposing the first dielectric layer; and
forming a second dielectric layer over the exposed first dielectric layer.

2. The method of claim 1, wherein forming the first metal layer includes depositing a first metal including copper, chromium, ruthenium, titanium, vanadium, palladium, indium, or combinations thereof.

3. The method of claim 1, wherein forming the second metal layer includes forming a second metal including molybdenum, osmium, iridium, cobalt, niobium, platinum, rhodium, rhenium, or combinations thereof.

4. The method of claim 1, wherein forming the hard mask layer includes depositing a metal-containing layer including titanium nitride, tantalum nitride, or a combination thereof.

5. The method of claim 1, wherein patterning the hard mask layer includes etching the hard mask layer with a fluorine-free plasma, and wherein etching the second metal layer includes applying a fluorine-containing plasma.

6. The method of claim 1, second metal layer, wherein treating the exposed portion of the first metal layer with the plasma that-includes applying an inert gas to form a porous first metal layer.

7. The method of claim 1, wherein removing the patterned hard mask layer includes applying an etchant that includes peroxide (H$_2$O$_2$), sulfuric acid (H$_2$SO$_4$), hydrofluoric acid (HF), hydrochloric acid (HCl), vinylhydroperoxide (CH$_2$CHOOH), phosphoric acid (H$_3$PO$_4$), nitric acid (HNO$_3$), ammonia (NH$_3$), deionized water (DI H$_2$O), or combinations thereof.

8. The method of claim 1, wherein forming the via includes forming an etch-stop layer (ESL) between the via and the first metal layer, and wherein sidewalls of the ESL are defined by the first dielectric layer.

9. A method, comprising:
 depositing an etch-stop layer (ESL) over a first interlayer dielectric (ILD) layer, wherein a via is embedded in the first ILD layer, and wherein the ESL includes a first metal;
 forming a metal layer over the ESL, wherein the metal layer includes a second metal;
 depositing a hard mask (HM) over the metal layer, wherein the HM includes a third metal, and wherein the second metal differs from the first metal and the third metal;
 performing a first dry etching process to pattern the HM;
 performing a second dry etching process to pattern the metal layer using the patterned HM as an etch mask, thereby exposing portions of the ESL;
 performing a wet etching process to remove the patterned HM, thereby exposing portions of the first ILD layer; and
 forming a second ILD layer over the exposed portions of the first ILD layer.

10. The method of claim 9, wherein depositing the ESL layer includes implementing an atomic layer deposition process, wherein forming the metal layer includes implementing a plating process, and wherein depositing the HM includes implementing an atomic layer deposition process.

11. The method of claim 9, wherein the first dry etching process implements a fluorine-free etchant.

12. The method of claim 9, wherein the second dry etching process implements a fluorine-containing etchant.

13. The method of claim 9, further comprising performing a third dry etching process to remove the exposed portions of the ESL after performing the second dry etching process.

14. The method of claim 9, wherein performing the wet etching process includes:
 treating the exposed portions of the ESL with an inert gas; and
 removing the patterned HM and the treated ESL with a wet etchant, wherein the wet etchant includes peroxide (H$_2$O$_2$), sulfuric acid (H$_2$SO$_4$), hydrofluoric acid (HF), hydrochloric acid (HCl), vinylhydroperoxide (CH$_2$CHOOH), phosphoric acid (H$_3$PO$_4$), nitric acid (HNO$_3$), ammonia (NH$_3$), deionized water (DI H$_2$O), or combinations thereof.

15. The method of claim 9, wherein an etching selectivity between the metal layer and the ESL is greater than an etching selectivity between the metal layer and the hard mask.

16. A method, comprising:
 forming a via in a first interlayer dielectric (ILD) layer disposed over a semiconductor substrate;
 forming a first metal layer over the via, wherein sidewalls of the first metal layer are defined by the first ILD layer, and wherein the first metal layer includes a first metal;
 forming a second metal layer over the first ILD, wherein the second metal layer includes a second metal different from the first metal;
 forming a third metal layer over the second metal layer, wherein the third metal layer includes a third metal different from the second metal;
 forming a patterned hard mask layer over the third metal layer;
 performing a dry etching process to the third metal layer through the patterned hard mask layer, thereby forming a conductive feature adjacent to a trench, wherein the trench exposes a portion of the second metal layer;
 performing a wet etching process to remove the patterned hard mask layer and the exposed portion of the second metal layer, thereby extending the trench to expose a portion of the first ILD layer; and
 forming a second ILD layer to fill the trench.

17. The method of claim 16, wherein forming the first metal layer includes:
 patterning the first ILD layer to form a via opening;
 partially filling the via opening to form the via, wherein a top surface of the via is lower than a top surface of the first ILD layer;
 forming the first metal layer over the via, wherein a portion of the first metal layer is formed over the top surface of the first ILD layer; and
 planarizing the first metal layer to expose the top surface of the first ILD layer.

18. The method of claim 16, wherein the second metal includes copper, chromium, ruthenium, titanium, vanadium, palladium, indium, or combinations thereof, and wherein the third metal includes molybdenum, osmium, iridium, cobalt, niobium, platinum, rhodium, rhenium, or combinations thereof.

19. The method of claim 16, wherein performing the dry etching process includes implementing a fluorine-containing etchant.

20. The method of claim 19, wherein the dry etching process is a first dry etching process, and wherein forming the patterned hard mask layer includes:
 depositing a hard mask layer over the third metal layer; and
 performing a second dry etching process to pattern the hard mask layer, wherein performing the second dry etching process implements a fluorine-free etchant.

* * * * *